US012777651B2

(12) United States Patent
Umeda et al.

(10) Patent No.: US 12,777,651 B2
(45) Date of Patent: Oct. 27, 2026

(54) SEMICONDUCTOR DEVICE AND METHOD FOR MANUFACTURING THE SAME

(71) Applicant: Kioxia Corporation, Tokyo (JP)

(72) Inventors: Chihiro Umeda, Yokkaichi Mie (JP); Yuta Kamiya, Nagoya Aichi (JP); Tomohisa Iino, Yokkaichi Mie (JP); Masaki Noguchi, Yokkaichi Mie (JP); Akira Takashima, Fuchu Tokyo (JP); Yusuke Nakajima, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 350 days.

(21) Appl. No.: 18/443,531

(22) Filed: Feb. 16, 2024

(65) Prior Publication Data

US 2024/0284677 A1 Aug. 22, 2024

(30) Foreign Application Priority Data

Feb. 17, 2023 (JP) ................................ 2023-023250

(51) Int. Cl.
*H10B 43/30* (2023.01)
*H10B 43/27* (2023.01)

(52) U.S. Cl.
CPC ............ *H10B 43/30* (2023.02); *H10B 43/27* (2023.02)

(58) Field of Classification Search
CPC ........ H10B 43/30; H10B 43/27; H10B 41/27; H10D 30/693
See application file for complete search history.

(56) References Cited

U.S. PATENT DOCUMENTS

| | | | | |
|---|---|---|---|---|
| 10,741,383 | B2 | 8/2020 | Noguchi et al. | |
| 2020/0227432 | A1* | 7/2020 | Lai | H10B 41/10 |
| 2021/0083128 | A1 | 3/2021 | Noguchi et al. | |
| 2022/0238444 | A1 | 7/2022 | Greenlee et al. | |
| 2022/0302139 | A1 | 9/2022 | Niguchi et al. | |

FOREIGN PATENT DOCUMENTS

| | | | |
|---|---|---|---|
| JP | 2019-102530 | A | 6/2019 |
| JP | 2021-044486 | A | 3/2021 |
| JP | 2022-144969 | A | 10/2022 |

* cited by examiner

*Primary Examiner* — Mohammed R Alam
(74) *Attorney, Agent, or Firm* — Foley & Lardner LLP

(57) ABSTRACT

A semiconductor device includes electrode layers and first insulating films alternately stacked on top of one another; a second insulating film extending along an upper surface, a lower surface, and a side surface of one of electrode layers; a charge storage layer extending along a side surface of the second insulating film with a third insulating film interposed therebetween; and a semiconductor layer extending along a side surface of the charge storage layer with a fourth insulating film interposed therebetween. A hydrogen concentration in the fourth insulating film is equal to or higher than a hydrogen concentration in the charge storage layer, which is equal to or higher than a hydrogen concentration in the third insulating film, which is equal to or higher than a hydrogen concentration in the second insulating film.

6 Claims, 10 Drawing Sheets

SEMICONDUCTOR DEVICE AND METHOD FOR MANUFACTURING THE SAME

CROSS-REFERENCE TO RELATED APPLICATION

This application is based upon and claims the benefit of priority from Japanese Patent Application No. 2023-023250, filed Feb. 17, 2023, the entire contents of which are incorporated herein by reference.

FIELD

Embodiments described herein relate generally to a semiconductor device and a method for manufacturing the same.

BACKGROUND

When manufacturing a three-dimensional semiconductor memory, there is a problem how to select a structure and a forming method of a memory cell.

DETAILED DESCRIPTION

Embodiments provide a semiconductor device capable of forming a suitable memory cell and a method for manufacturing the same.

In general, according to one embodiment, a semiconductor device includes a stacked film including a plurality of electrode layers and a plurality of first insulating films alternately stacked on top of one another; a second insulating film extending along an upper surface, a lower surface, and a side surface of at least one of the plurality of electrode layers; a charge storage layer extending along a side surface of the second insulating film with a third insulating film interposed between the second insulating film and the charge storage layer; and a semiconductor layer extending along a side surface of the charge storage layer with a fourth insulating film interposed between the charge storage layer and the semiconductor layer. A hydrogen concentration in the fourth insulating film is equal to or higher than a hydrogen concentration in the charge storage layer. The hydrogen concentration in the charge storage layer is equal to or higher than a hydrogen concentration in the third insulating film. The hydrogen concentration in the third insulating film is equal to or higher than a hydrogen concentration in the second insulating film.

Hereinafter, embodiments of the present disclosure will be described with reference to the drawings. In FIGS. 1 to 10B, the same components are denoted by the same reference symbols, and redundant description will be omitted.

First Embodiment

Figure 1:
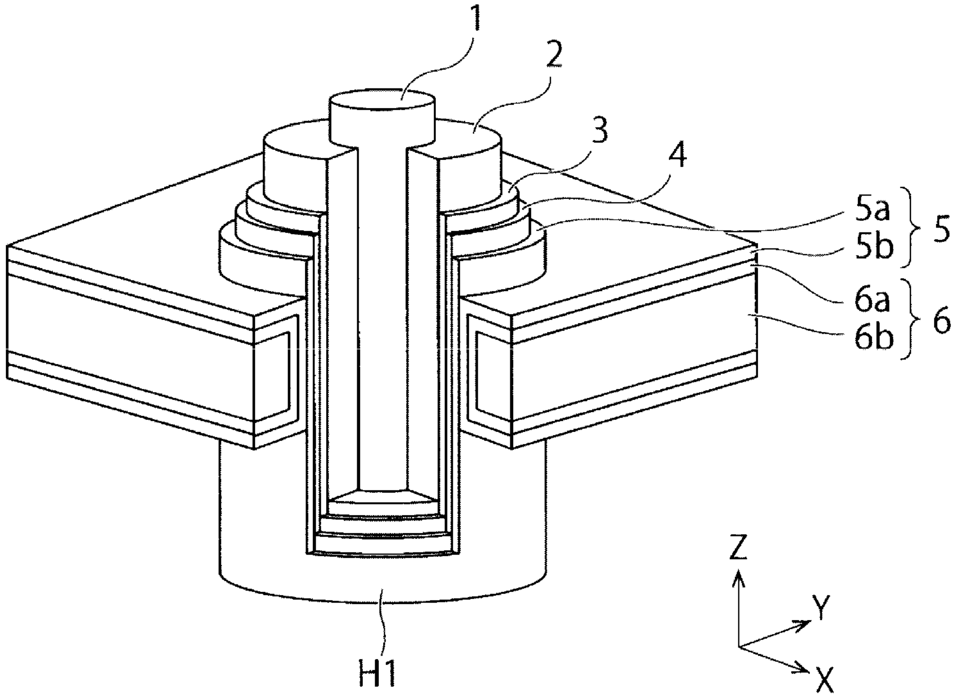
FIG. 1 is a perspective view showing a structure of a semiconductor device according to the first embodiment.

FIG. 1 is a perspective view showing a structure of a semiconductor device according to the first embodiment. The semiconductor device of the present embodiment includes, for example, a three-dimensional semiconductor memory.

The semiconductor device of the present embodiment includes a core insulating film 1, a channel semiconductor layer 2, a tunnel insulating film 3, a charge storage layer 4, a block insulating film 5, and an electrode layer 6. The block insulating film 5 includes an insulating film 5*a* and an insulating film 5*b*. The electrode layer 6 includes a barrier metal layer 6*a* and an electrode material layer 6*b*. The tunnel insulating film 3 is an example of a fourth insulating film. The insulating film 5*a* is an example of a third insulating film. The insulating film 5*b* is an example of a second insulating film.

In FIG. 1, a plurality of electrode layers and a plurality of insulating films are alternately stacked on a substrate, and a memory hole H1 is provided in the electrode layers and the insulating films. FIG. 1 shows one of the electrode layers, the electrode layer 6. The electrode layers function as, for example, a word line of the three-dimensional semiconductor memory. FIG. 1 shows X and Y directions parallel to a surface of the substrate and perpendicular to each other, and a Z direction perpendicular to the surface of the substrate. In the present specification, a +Z direction is treated as an upward direction, and a −Z direction is treated as a downward direction. The −Z direction may or may not coincide with a gravity direction.

The core insulating film 1, the channel semiconductor layer 2, the tunnel insulating film 3, the charge storage layer 4, and the insulating film 5*a* are formed in the memory hole H1 and form a memory cell of the three-dimensional semiconductor memory. The insulating film 5*a* is formed on side surfaces of the electrode layer and the insulating film in the memory hole H1, and the charge storage layer 4 is formed on a side surface of the insulating film 5*a*. The charge storage layer 4 may accumulate a signal charge of the three-dimensional semiconductor memory. The tunnel insulating film 3 is formed on a side surface of the charge storage layer 4, and the channel semiconductor layer 2 is formed on a side surface of the tunnel insulating film 3. The channel semiconductor layer 2 functions as a channel of the three-dimensional semiconductor memory. The core insulating film 1 is formed on a side surface of the channel semiconductor layer 2.

The insulating film 5*a* is, for example, a silicon oxide ($SiO_2$) film. The charge storage layer 4 is, for example, a silicon nitride (SiN) film. The tunnel insulating film 3 is, for example, a silicon oxynitride (SiON) film. The tunnel insulating film 3 may be the $SiO_2$ film. The channel semiconductor layer 2 is, for example, a polysilicon layer. The core insulating film 1 is, for example, a $SiO_2$ film.

The insulating film 5*b*, the barrier metal layer 6*a*, and the electrode material layer 6*b* are formed between two insulating films among the plurality of insulating films, and are sequentially formed on a lower surface of an upper insulating film, an upper surface of a lower insulating film, and the side surface of the insulating film 5*a*. Therefore, the insulating film 5*b* is formed on an upper surface, a lower surface, and a side surface of the electrode layer 6, and the insulating film 5*a* is formed on a side surface of the insulating film 5*b*. The plurality of insulating films are examples of the first insulating film.

The insulating film 5*b* is, for example, a hafnium oxide ($HfO_x$) film. The insulating film 5*b* may be an aluminum oxide ($AlO_x$) film or a zirconium oxide ($ZrO_x$) film (x represents a positive real number). The barrier metal layer 6*a* is, for example, a titanium nitride (TiN) film. The electrode material layer 6*b* is, for example, a tungsten (W) layer.

The tunnel insulating film 3, the charge storage layer 4, the insulating film 5*a*, the insulating film 5*b*, and the like of the present embodiment contain hydrogen, for example, contain hydrogen atoms as impurity atoms. For example, in a case of forming the $SiO_2$ film, the SiN film, the SiON film, or the like described above, the hydrogen atoms penetrate into the tunnel insulating film 3, the charge storage layer 4, the insulating film 5*a*, the insulating film 5*b*, and the like by using a source gas containing silicon and hydrogen. When hydrogen concentrations in the tunnel insulating film 3, the charge storage layer 4, the insulating film 5*a*, and the insulating film 5*b* are denoted by $A_3$, $A_4$, $A_{5a}$, and $A_{5b}$, respectively, in the present embodiment, the relationship of $A_3 \geq A_4 \geq A_{5a} \geq A_{5b}$ is established. The hydrogen concentration $A_4$ in the charge storage layer 4 of the present embodiment is, for example, equal to or lower than $1.0 \times 10^{20}$ atoms/cm$^3$. Further details of the hydrogen concentrations $A_3$, $A_4$, $A_{5a}$, and $A_{5b}$ of the present embodiment will be described below.

FIGS. 2 to 5 are cross-sectional views showing the method for manufacturing a semiconductor device according to the first embodiment.

Figure 2:
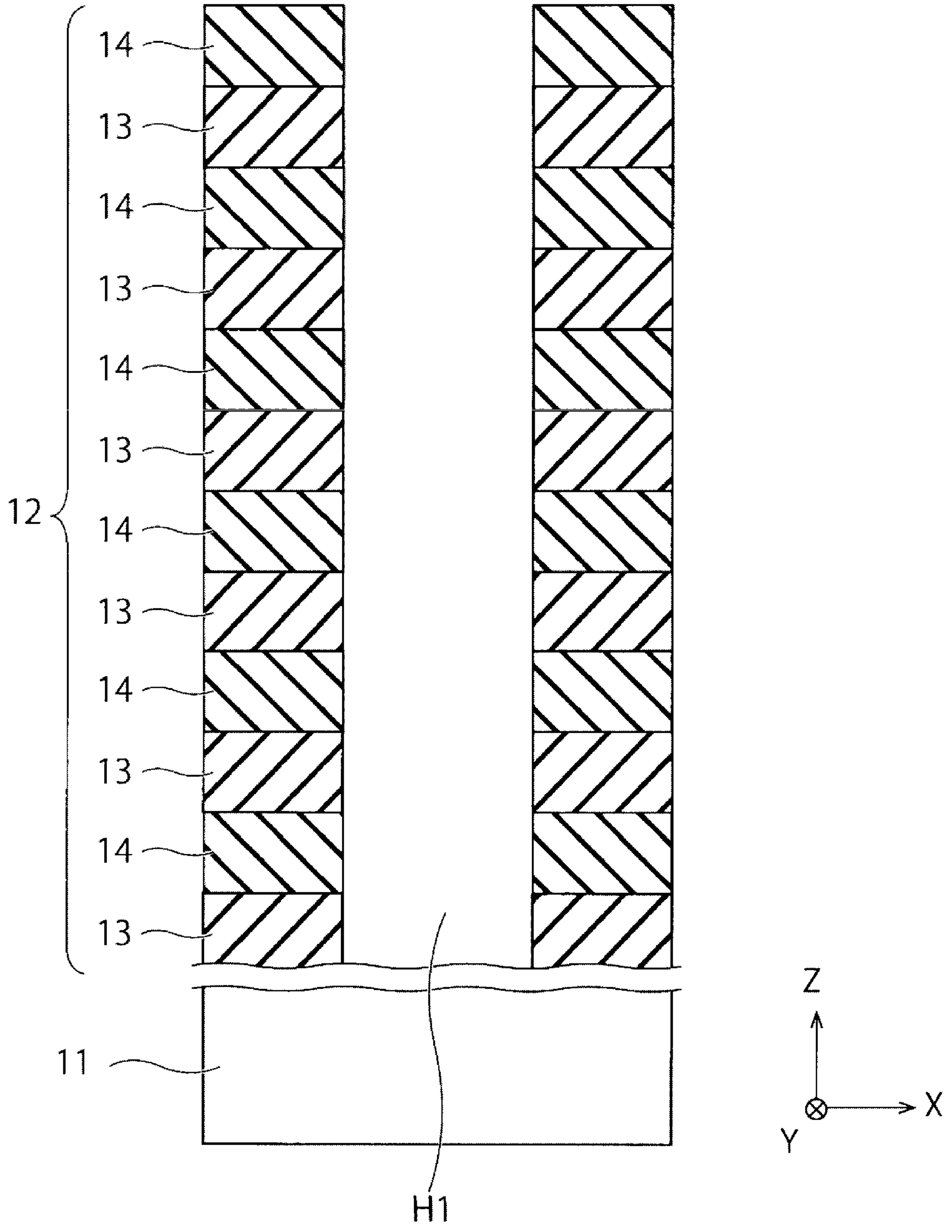
FIG. 2 is a cross-sectional view (1/4) showing a method for manufacturing a semiconductor device according to the first embodiment.

First, the substrate 11 is prepared, and a stacked film 12 alternately including a plurality of sacrificial layers 13 and a plurality of insulating films 14 is formed on the substrate 11 (FIG. 2). The stacked film 12 is formed by alternately stacking the plurality of sacrificial layers 13 and the plurality of insulating films 14 on the substrate 11. The stacked film 12 may be directly formed on the substrate 11 or may be formed on the substrate 11 through other layers. The substrate 11 is, for example, a semiconductor substrate such as a silicon (Si) substrate. The sacrificial layer 13 is, for example, a SiN film. The insulating film 14 is, for example, a $SiO_2$ film. The sacrificial layer 13 is an example of the first layer, and the insulating film 14 is an example of the first insulating film.

Next, a plurality of memory holes H1 are formed in the stacked film 12 by photolithography and reactive ion etching (RIE) (FIG. 2). FIG. 2 shows one of the memory holes H1. Each of the memory holes H1 of the present embodiment has a circular shape in a plan view and penetrates the stacked film 12.

Figure 3:
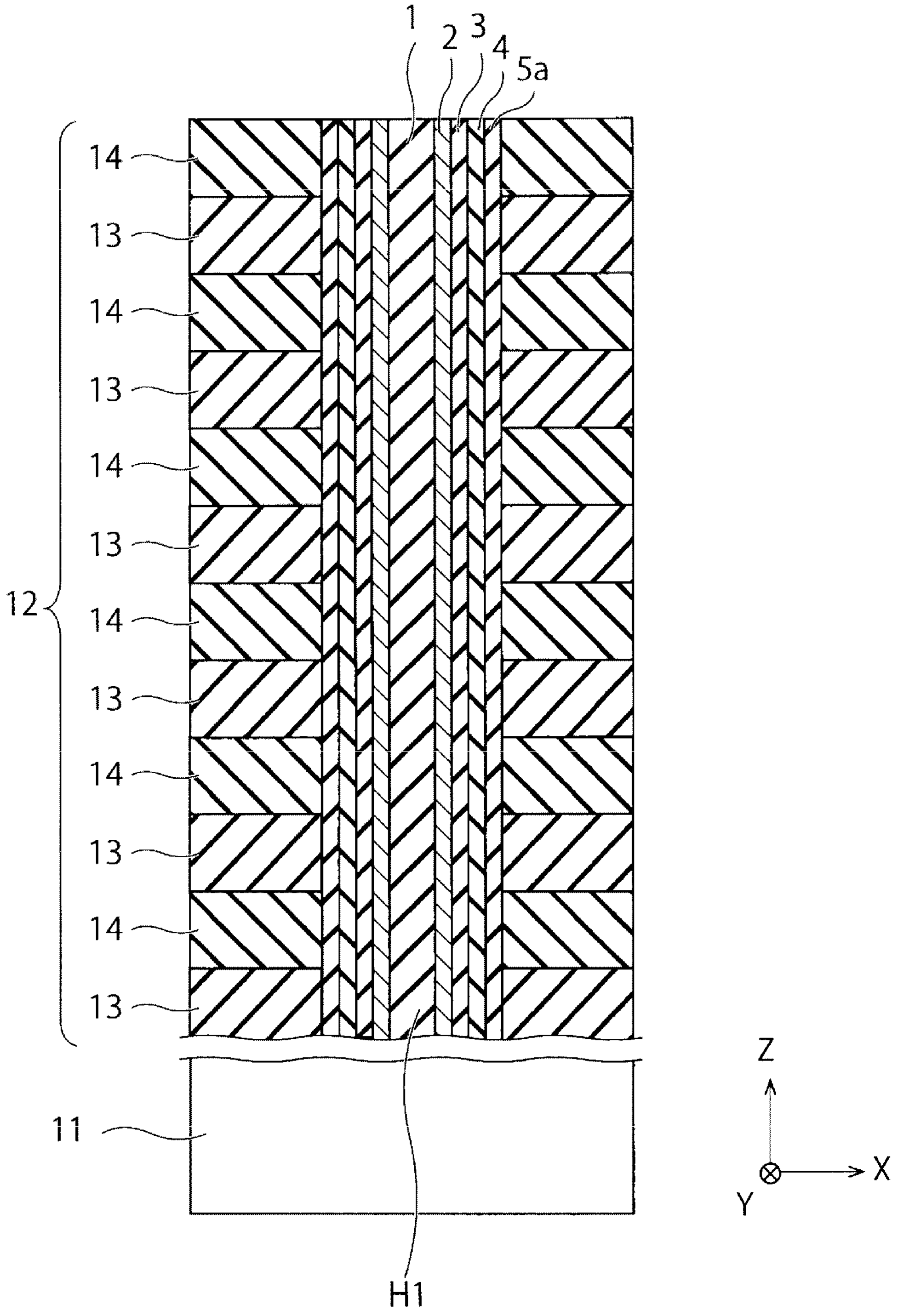
FIG. 3 is a cross-sectional view (2/4) showing the method for manufacturing a semiconductor device according to the first embodiment.

Next, the insulating film 5*a*, the charge storage layer 4, the tunnel insulating film 3, the channel semiconductor layer 2, and the core insulating film 1 are sequentially formed on side surfaces of the stacked films 12 in each of the memory holes H1 (FIG. 3). The insulating film 5*a*, the charge storage layer 4, the tunnel insulating film 3, and the channel semiconductor layer 2 have a tubular shape extending in the Z direction. The core insulating film 1 has a columnar shape extending in the Z direction.

Figure 4:
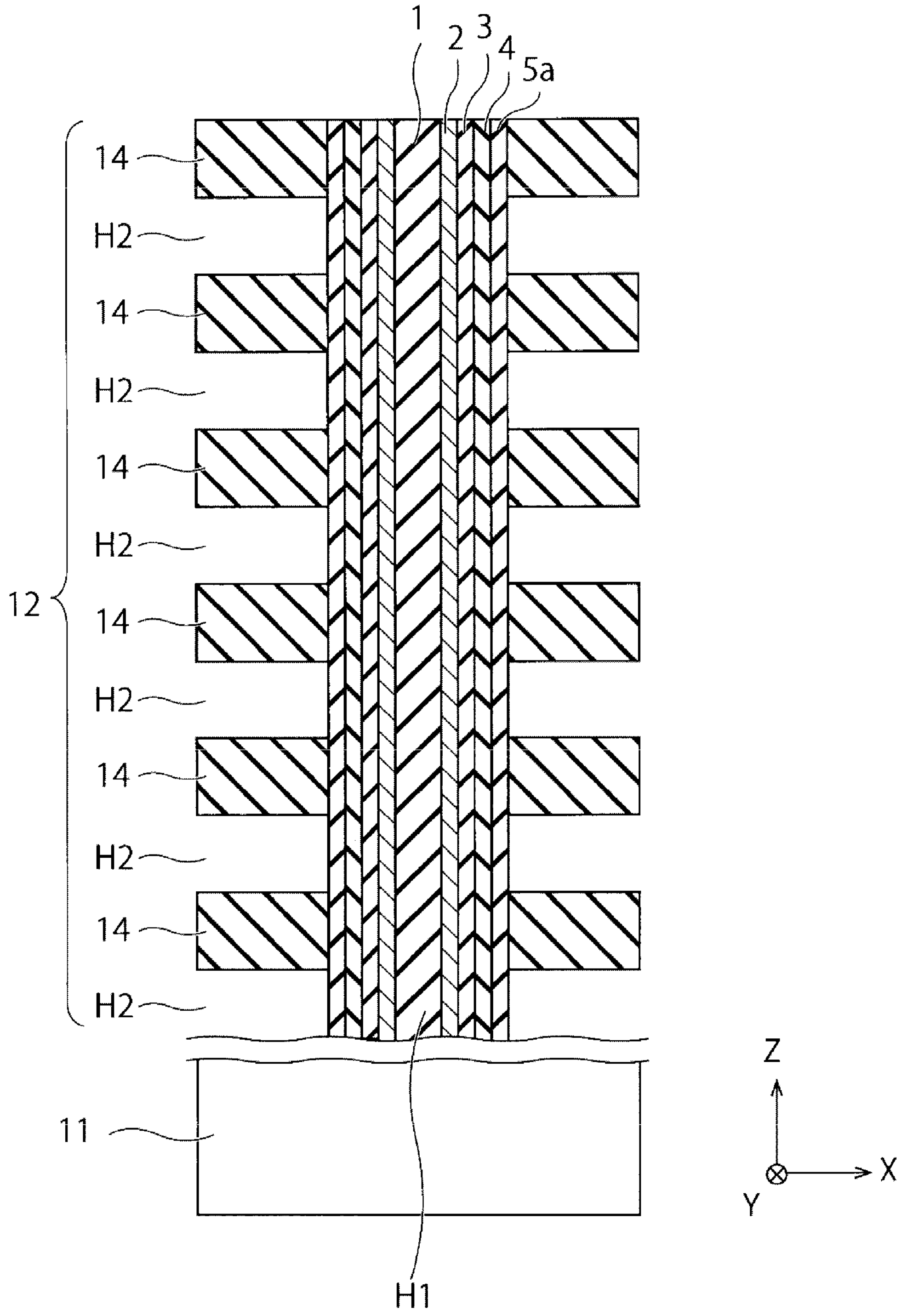
FIG. 4 is a cross-sectional view (3/4) showing the method for manufacturing a semiconductor device according to the first embodiment.

Next, a plurality of slits (not shown) are formed in the stacked film 12, and the sacrificial layer 13 is removed from the slits with a chemical solution such as a phosphoric acid aqueous solution. As a result, a plurality of recessed portions H2 are formed in the stacked film 12 (FIG. 4). The recessed portion H2 is an example of the first recessed portion.

Figure 5:
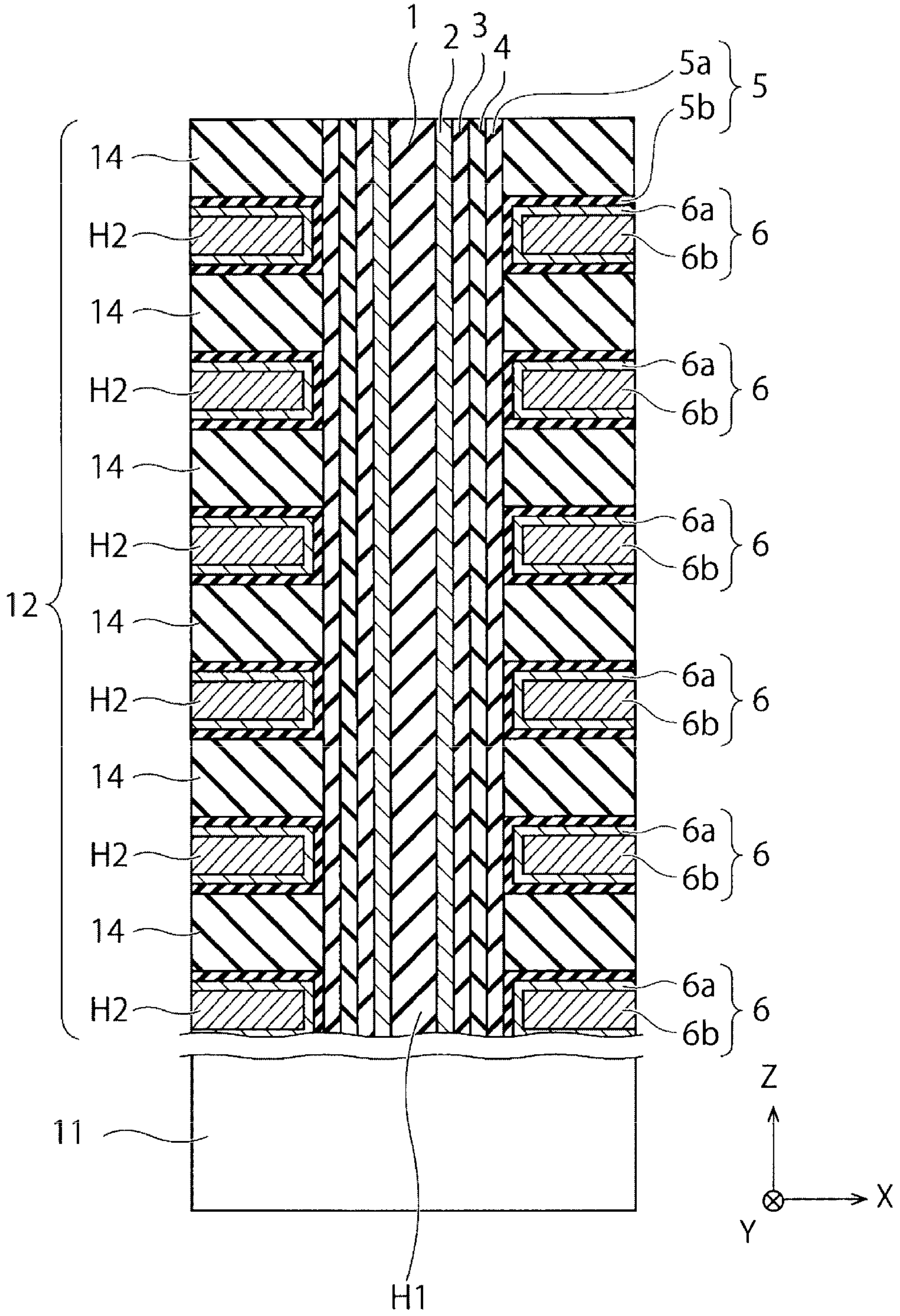
FIG. 5 is a cross-sectional view (4/4) showing the method for manufacturing a semiconductor device according to the first embodiment.

Next, the insulating film 5*b*, the barrier metal layer 6*a*, and the electrode material layer 6*b* are sequentially formed on the surfaces of the insulating films 5*a* and 14 in each of the recessed portions H2 (FIG. 5). As a result, a block insulating film 5 including the insulating films 5*a* and 5*b* is formed. Furthermore, the electrode layer 6 including the barrier metal layer 6*a* and the electrode material layer 6*b* is formed in each recessed portion H2. Furthermore, the stacked film 12 alternately including the plurality of electrode layers 6 and the plurality of insulating films 14 is formed on the substrate 11. In this manner, the replacement step of replacing the sacrificial layer 13 with the electrode layer 6 is performed.

Each recessed portion H2 is formed between the two insulating films 14 adjacent to each other in the Z direction. In each recessed portion H2, the insulating film 5*b*, the barrier metal layer 6*a*, and the electrode material layer 6*b* are sequentially formed on the lower surface of the upper insulating film 14, the upper surface of the lower insulating film 14, and the side surface of the insulating film 5*a*. As a result, each electrode layer 6 is formed between the insulating films 14 with the insulating film 5*b* interposed therebetween.

As such, the semiconductor device of the present embodiment is manufactured (FIG. 5). FIG. 1 shows a part of the semiconductor device shown in FIG. 5.

Figure 6A:
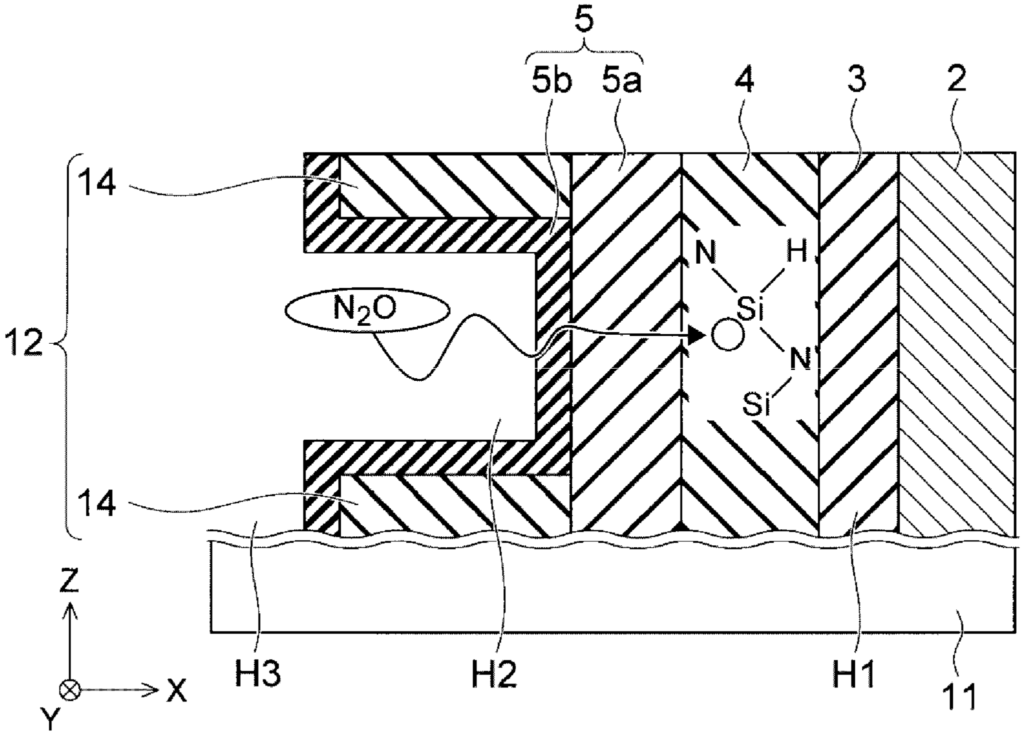
FIGS. 6A and 6B are cross-sectional views showing details of the method for manufacturing a semiconductor device according to the first embodiment.
Figure 6B:
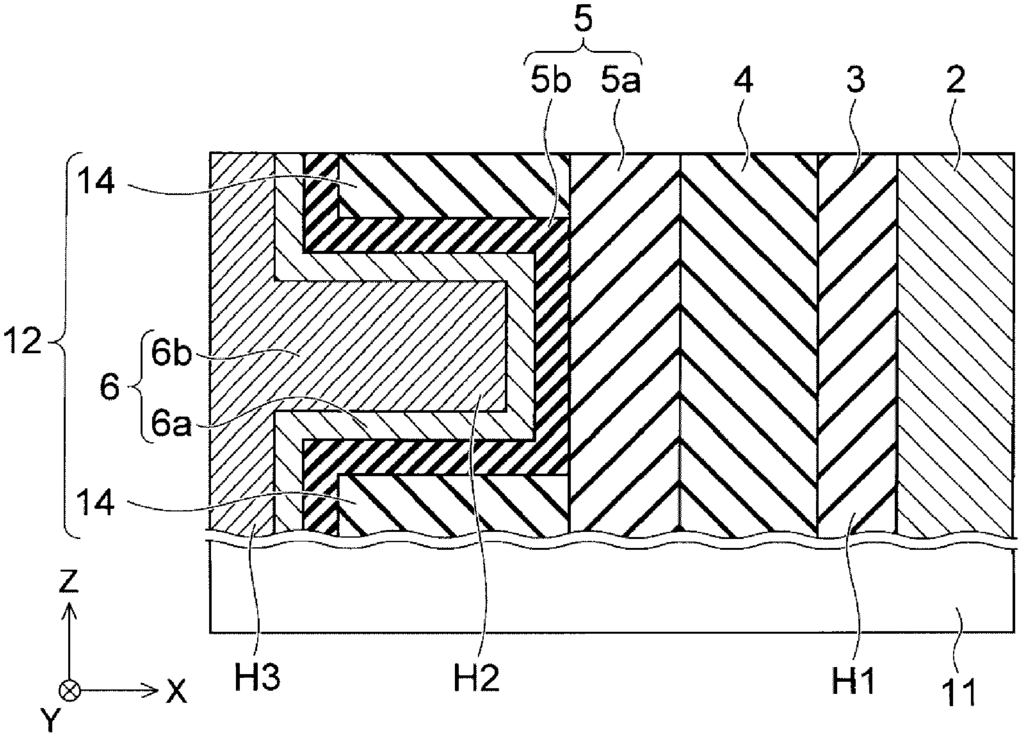

FIGS. 6A and 6B are cross-sectional views showing details of the method for manufacturing a semiconductor device according to the first embodiment.

FIG. 6A shows a rapid thermal process (RTP) performed in the step of FIG. 5. In the present embodiment, the RTP is performed after the formation of the insulating film 5*b* and before the formation of the barrier metal layer 6*a*. In the present embodiment, the insulating film 5*b*, the insulating film 5*a*, the charge storage layer 4, the tunnel insulating film 3, and the like are annealed by the RTP shown in FIG. 6A. For example, the temperature of the RTP is set to 1000° C. or higher, and the time of performing the RTP is set to equal to or shorter than 180 seconds.

FIG. 6A further shows a slit H3 formed in the stacked film 12. As described above, the slit H3 is used to remove the sacrificial layer 13 with a chemical solution such as a phosphoric acid aqueous solution from the slit H3. The slit H3 is further used to supply a gas for RTP (hereinafter, referred to as "annealing gas") to the recessed portion H2. The annealing gas is, for example, $N_2O$ gas (N represents nitrogen, and O represents oxygen). The annealing gas may be the other gases containing nitrogen and oxygen, for example, may be NO gas or $NO_x$ gas (x represents an integer of 2 or more). The annealing gas is an example of the first gas.

When the annealing gas is $N_2O$ gas, NO gas, or $NO_x$ gas, the molecules contained in the annealing gas are $N_2O$ molecules, NO molecules, or $NO_x$ molecules. The molecules contain N atoms and O atoms, but do not contain H (hydrogen) atoms. As described above, it is desirable that the molecules contained in the annealing gas of the present embodiment contain N atoms and O atoms, and do not contain H atoms. The molecules contained in the annealing gas are examples of the first molecule.

According to the present embodiment, by performing the RTP shown in FIG. 6A, it is possible to improve a film quality of the insulating films 5$a$ and 5$b$ and to reduce a hydrogen concentration in the charge storage layer 4. For example, by improving the film quality of the insulating films 5$a$ and 5$b$, it is possible to reduce a leakage current at the time of writing data to the memory cell and to improve write saturation. In addition, by reducing the hydrogen concentration in the charge storage layer 4, it is possible to increase the dangling bond in the charge storage layer 4 as shown in FIG. 6A, and it is possible to improve the write efficiency. The hydrogen concentration ($A_4$) in the charge storage layer 4 after the RTP is, for example, equal to or lower than $1.0\times10^{20}$ atoms/$cm^3$.

In addition, according to the present embodiment, it is possible to greatly reduce a hydrogen concentration in a film close to the recessed portion H2 and to slightly reduce a hydrogen concentration in a film far from the recessed portion H2. As a result, it is possible to realize the relationship of $A_3 \geq A_4 \geq A_{5a} \geq A_{5b}$ with respect to the hydrogen concentrations $A_3$, $A_4$, $A_{5a}$, and $A_{5b}$ in the tunnel insulating film 3, the charge storage layer 4, the insulating film 5$a$, and the insulating film 5$b$. According to such a concentration gradient, it is possible to further improve the write efficiency.

FIG. 6B shows subsequent processing performed in the step of FIG. 5. In the present embodiment, after performing the RTP described above, the barrier metal layer 6$a$ and the electrode material layer 6$b$ are sequentially formed in each recessed portion H2. In FIG. 6B, the same insulating film 5$b$, barrier metal layer 6$a$, and electrode material layer 6$b$ are present in the plurality of recessed portions H2 or in the slits H3 connected to the recessed portions H2. Thereafter, the insulating film 5$b$, the barrier metal layer 6$a$, and the electrode material layer 6$b$ in the slit H3 are removed, and the insulating film 5$b$, the barrier metal layer 6$a$, and the electrode material layer 6$b$ are divided for each recessed portion H2. FIG. 5 shows the insulating film 5$b$, the barrier metal layer 6$a$, and the electrode material layer 6$b$ after being divided into each recessed portion H2.

Next, the material of the insulating film 5$b$ will be described.

The insulating film 5$b$ is, for example, a $HfO_x$ film. When the insulating film 5$b$ is the $HfO_x$ film, it is possible to improve the charge retention characteristics and the erasing characteristics of the memory cell as compared with a case where the insulating film 5$b$ is the $AlO_x$ film. On the other hand, when the insulating film 5$b$ is the $HfO_x$ film, there is a concern that the write characteristics of the memory cell may deteriorate as compared with a case where the insulating film 5$b$ is the $AlO_x$ film.

Therefore, in the present embodiment, the insulating film 5$b$, the insulating film 5$a$, the charge storage layer 4, the tunnel insulating film 3, and the like are annealed by the RTP described above. As a result, it is possible to solve the problem of deterioration of the write characteristics of the memory cell by improving the write saturation and the write efficiency of the memory cell.

According to the RTP of the present embodiment, it is possible to improve the charge retention characteristics and the erasing characteristics of the memory cell even when the insulating film 5$b$ is the $HfO_x$ film or when the insulating film 5$b$ is other than the $HfO_x$ film (for example, the $AlO_x$ film). According to the RTP of the present embodiment, when the insulating film 5$b$ is the $HfO_x$ film, it is possible to improve the charge retention characteristics and the erasing characteristics of the memory cell, and it is possible to further improve the write characteristics of the memory cell.

Figure 7A:
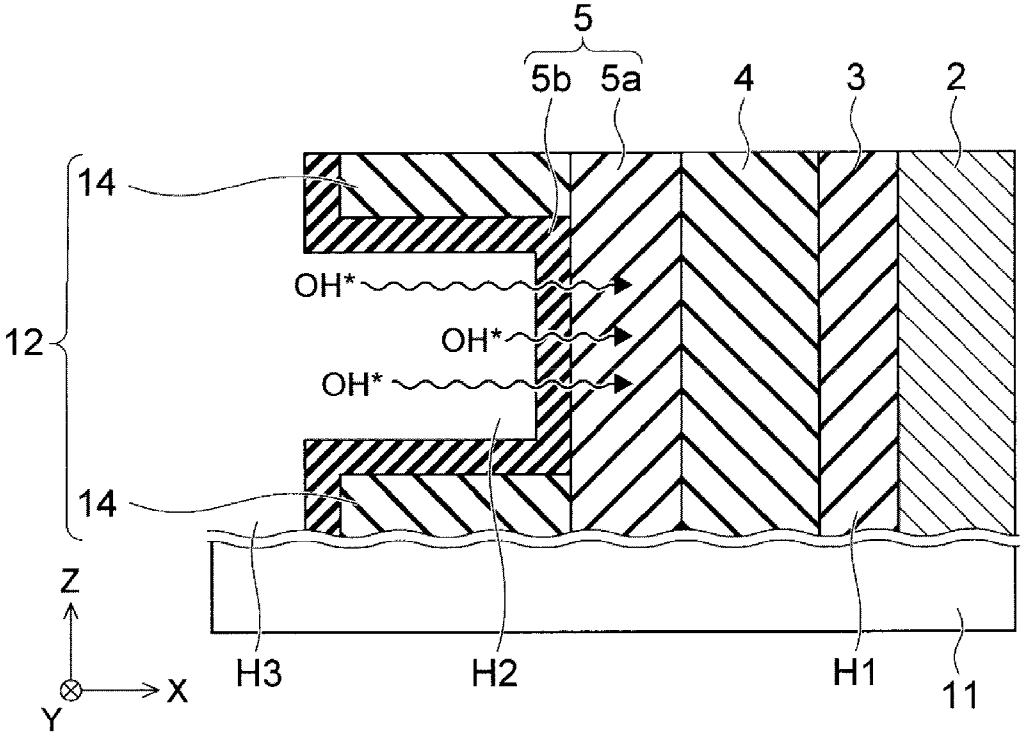
FIGS. 7A and 7B are cross-sectional views for comparing the method for manufacturing a semiconductor device according to a comparative example of the first embodiment and the method for manufacturing a semiconductor device according to the first embodiment.
Figure 7B:
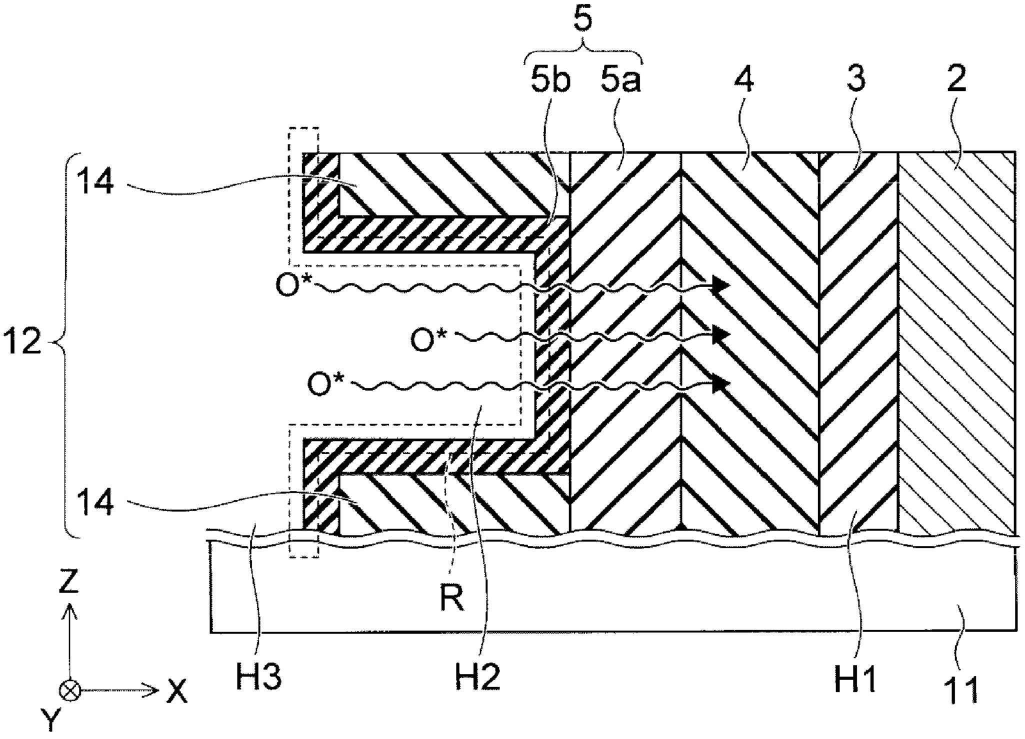

FIGS. 7A and 7B are cross-sectional views for comparing the method for manufacturing a semiconductor device according to a comparative example of the first embodiment and the method for manufacturing a semiconductor device according to the first embodiment.

FIG. 7A shows RTP performed when the semiconductor device of a comparative example of the first embodiment is manufactured. The RTP shown in FIG. 7A is performed using an OH radical (hydroxyl radical) generated from the annealing gas. The annealing gas includes, for example, an $O_2$ gas and an $H_2$ gas.

FIG. 7B shows RTP performed when the semiconductor device of the first embodiment is manufactured, as shown in FIG. 6A. The RTP shown in FIG. 7B is performed using an O radical (oxygen radical) generated from the annealing gas. The annealing gas includes, for example, $N_2O$ gas, NO gas, or $NO_x$ gas, but does not include a gas containing an H atom.

Reference symbol R shown in FIG. 7B indicates a region near the surface of the insulating film 5$b$. The O radical is generated, for example, by a chemical reaction of $N_2O$ gas, NO gas, or $NO_x$ gas near the surface of the insulating film 5$b$. The O radical enters the insulating film 5$b$, the insulating film 5$a$, the charge storage layer 4, the tunnel insulating film 3, and the like and reacts with the H atom. As a result, the H concentration decreases in the insulating film 5$b$, the insulating film 5$a$, the charge storage layer 4, and the tunnel insulating film 3. For example, the O radical diffuses to the charge storage layer 4 and dissociates a H terminal in the charge storage layer 4, thereby decreasing the H concentration in the charge storage layer 4.

In the step shown in FIG. 7B, after performing the RTP, the insulating film 5$b$, the insulating film 5$a$, the charge storage layer 4, the tunnel insulating film 3, and the like may be treated using a deuterium ($D_2$) gas. As a result, it is possible to terminate the dangling bond of the charge storage layer 4 or the like with deuterium.

Figure 8A:
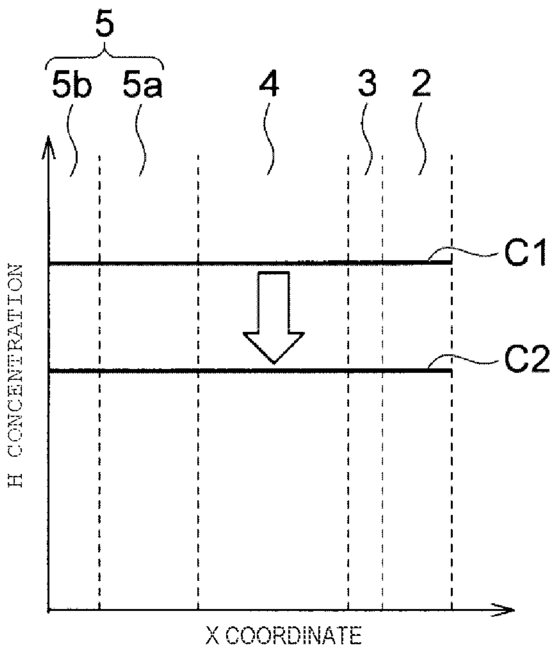
FIGS. 8A and 8B are graphs showing characteristics of the semiconductor device of the first embodiment.
Figure 8B:
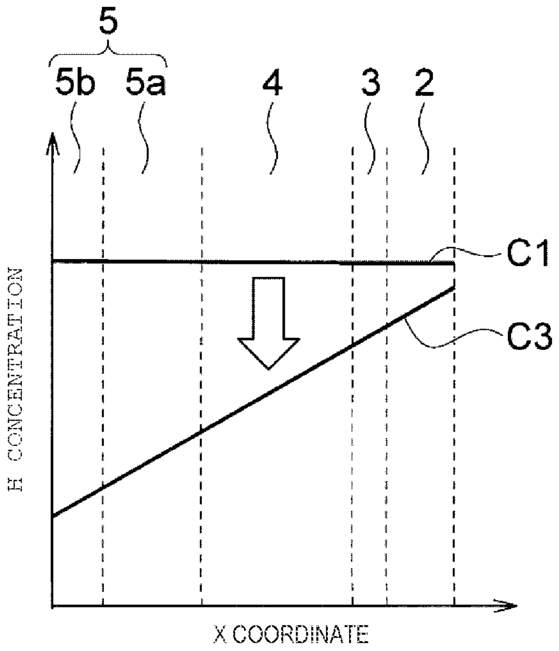

FIGS. 8A and 8B are graphs showing characteristics of the semiconductor device of the first embodiment.

Each of FIG. 8A and FIG. 8B shows the H concentration in the insulating film 5$b$, the insulating film 5$a$, the charge storage layer 4, the tunnel insulating film 3, and the channel semiconductor layer 2 on a straight line extending in the X direction. The straight line passes through a point on a central axis of the memory hole H1 shown in FIGS. 1 and 5. That is, the straight line extends parallel to a radial direction of the central axis of the memory hole H1. Each of FIG. 8A and FIG. 8B shows a local H concentration at an individual point on the straight line extending in the X direction. The X direction is an example of the first direction.

A line C1 shown in FIG. 8A and FIG. 8B indicates the H concentration before performing the RTP. A line C2 shown in FIG. 8A indicates the H concentration after performing the RTP. A line C3 shown in FIG. 8B also indicates the H concentration after performing the RTP. According to the RTP of the present embodiment, it is possible to achieve the H concentration indicated by the line C3 instead of the line C2.

In the example shown in FIG. 8B, the H concentration indicated by the line C1, that is, the H concentration before performing the RTP is substantially constant in the insulating film 5*b*, the insulating film 5*a*, the charge storage layer 4, the tunnel insulating film 3, and the channel semiconductor layer 2. The H concentration on the line C1 is, for example, equal to or higher than $1.0\times10^{21}$ atoms/cm$^3$.

On the other hand, the H concentration indicated by the line C3, that is, the H concentration after performing the RTP, increases as it progresses in the X direction. The reason is that the RTP of the present embodiment greatly reduces the H concentration at the position close to the recessed portion H2 and slightly reduces the hydrogen concentration at the position far from the recessed portion H2. The line C3 has a monotonically increasing function in which the H concentration increases as X increases. On the line C3, a relationship of $A_3 \geq A_4 \geq A_{5a} \geq A_{5b}$ is established between the H concentration $A_3$ at a certain point in the tunnel insulating film 3, the H concentration $A_4$ at a certain point in the charge storage layer 4, the H concentration $A_{5a}$ at a certain point in the insulating film 5*a*, and the H concentration $A_{5b}$ at a certain point in the insulating film 5*b*. According to such a concentration gradient, it is possible to improve the write efficiency of the memory cell. The line C3 is a straight line in which the relationship of $A_3 \geq A_4 \geq A_{5a} \geq A_{5b}$ is established, but alternatively, the line C3 may be a curve in which the relationship of $A_3 \geq A_4 \geq A_{5a} \geq A_{5b}$ is established.

On the line C3, the hydrogen concentration $A_4$ at all of the points in the charge storage layer 4 may be equal to or lower than $1.0\times10^{20}$ atoms/cm$^3$, or only the hydrogen concentration $A_4$ at some of the points in the charge storage layer 4 may be equal to or lower than $1.0\times10^{20}$ atoms/cm$^3$. For example, the average of the hydrogen concentration $A_4$ in the charge storage layer 4 may be equal to or lower than $1.0\times10^{20}$ atoms/cm$^3$. In the present embodiment, it is desirable that the hydrogen concentration $A_4$ at all the points in the charge storage layer 4 is equal to or lower than $1.0\times10^{20}$ atoms/cm$^3$.

Figure 9A:
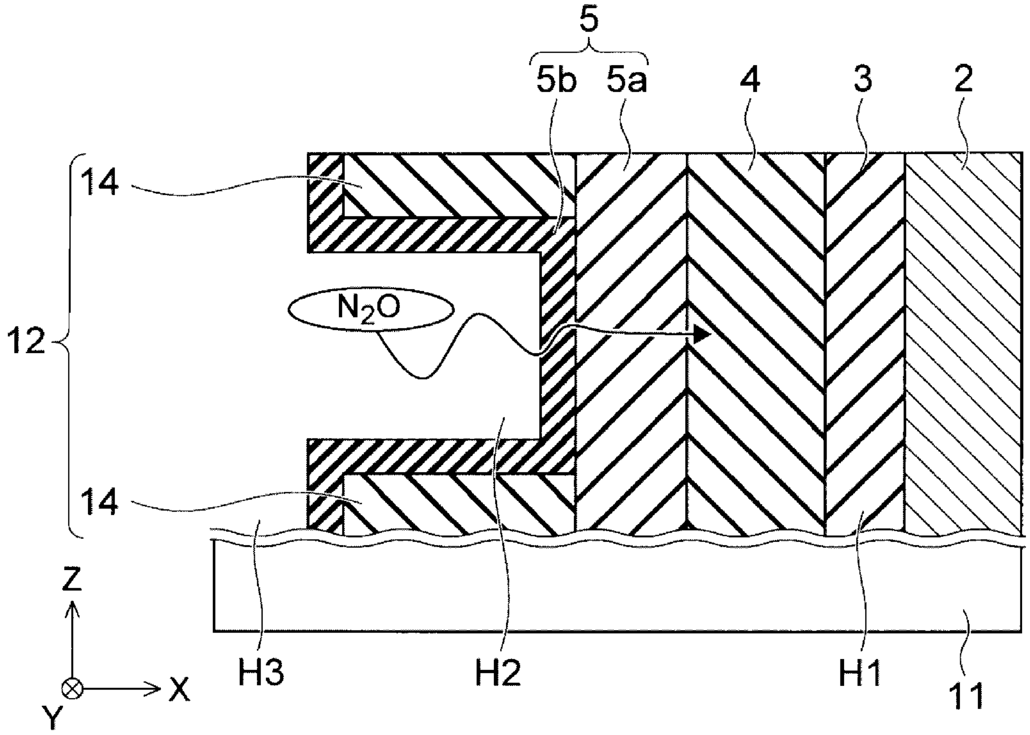
FIGS. 9A and 9B are cross-sectional views showing details of the method for manufacturing a semiconductor device according to the first embodiment.
Figure 9B:
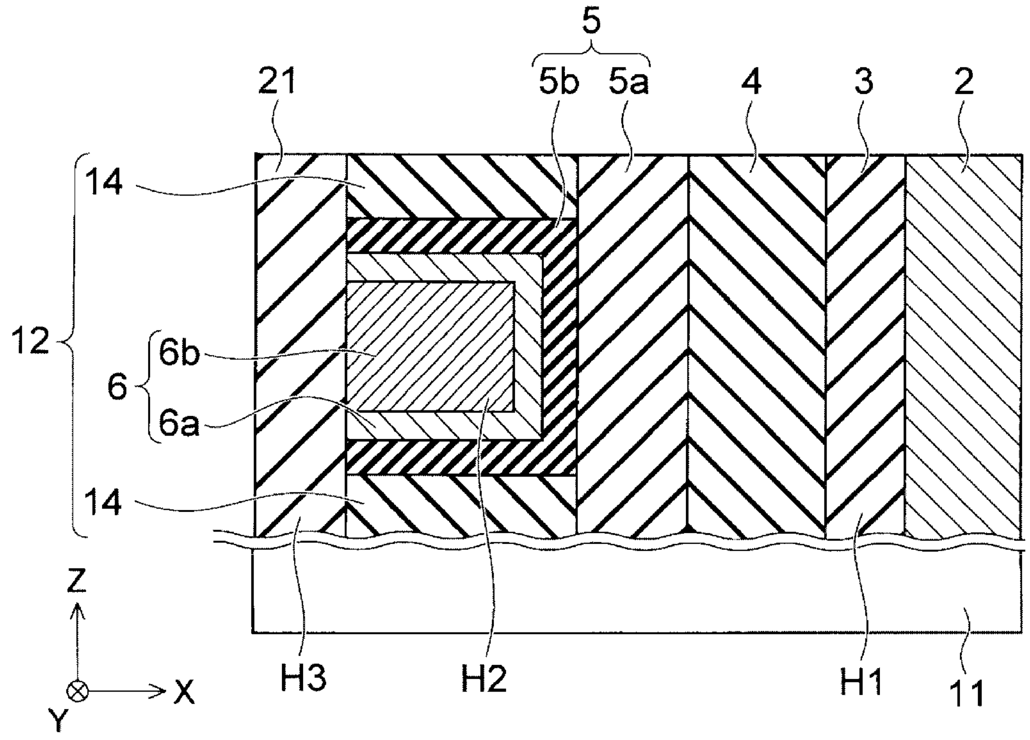

FIGS. 9A and 9B are cross-sectional views showing details of the method for manufacturing a semiconductor device according to the first embodiment.

FIGS. 9A and 9B show the steps shown in FIG. 5, as in FIG. 6A and FIG. 6B. First, the insulating film 5*b* is formed in the slit H3 and the recessed portion H2, and then RTP is performed (FIG. 9A). Next, the barrier metal layer 6*a* and the electrode material layer 6*b* are sequentially formed in the slit H3 and the recessed portion H2, the electrode material layer 6*b*, the barrier metal layer 6*a*, and the insulating film 5*b* are removed from the slit H3, and the insulating film 21 is formed in the slit H3 (FIG. 9B). As such, the semiconductor device of the present embodiment is manufactured.

The slit H3 may be filled only with the insulating film 21 or may be filled with the insulating film 21 and the wiring layer. Accordingly, it is possible to provide a wiring (for example, a gate line) in the slit H3.

Figure 10A:
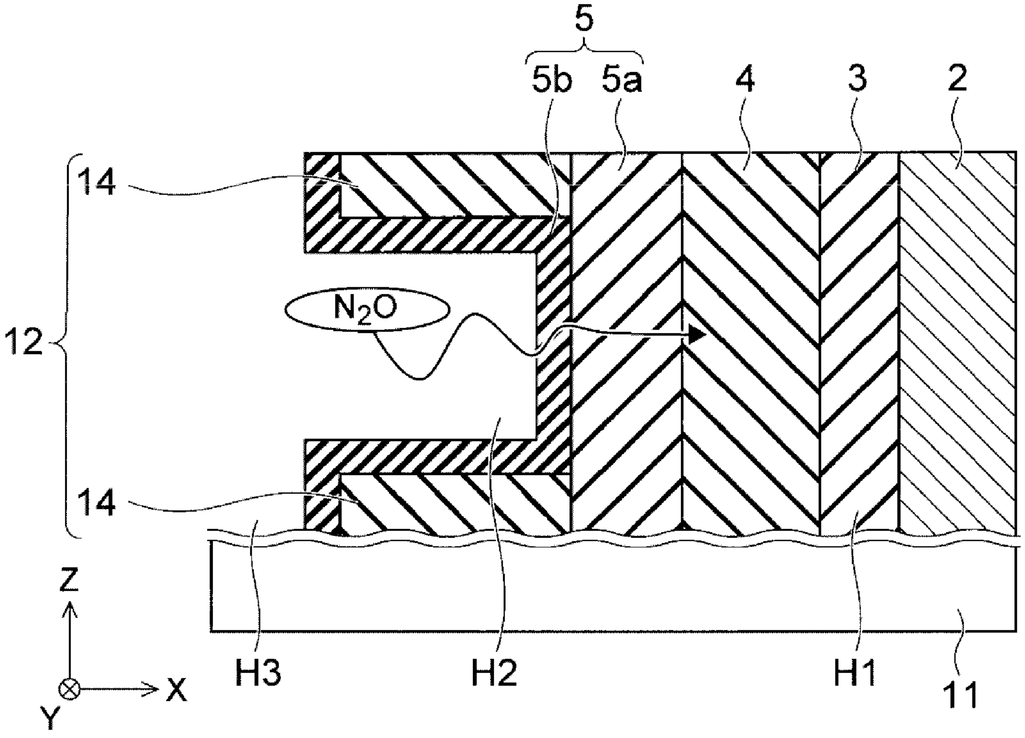
FIGS. 10A and 10B are cross-sectional views showing details of the method for manufacturing a semiconductor device according to a modification example of the first embodiment.
Figure 10B:
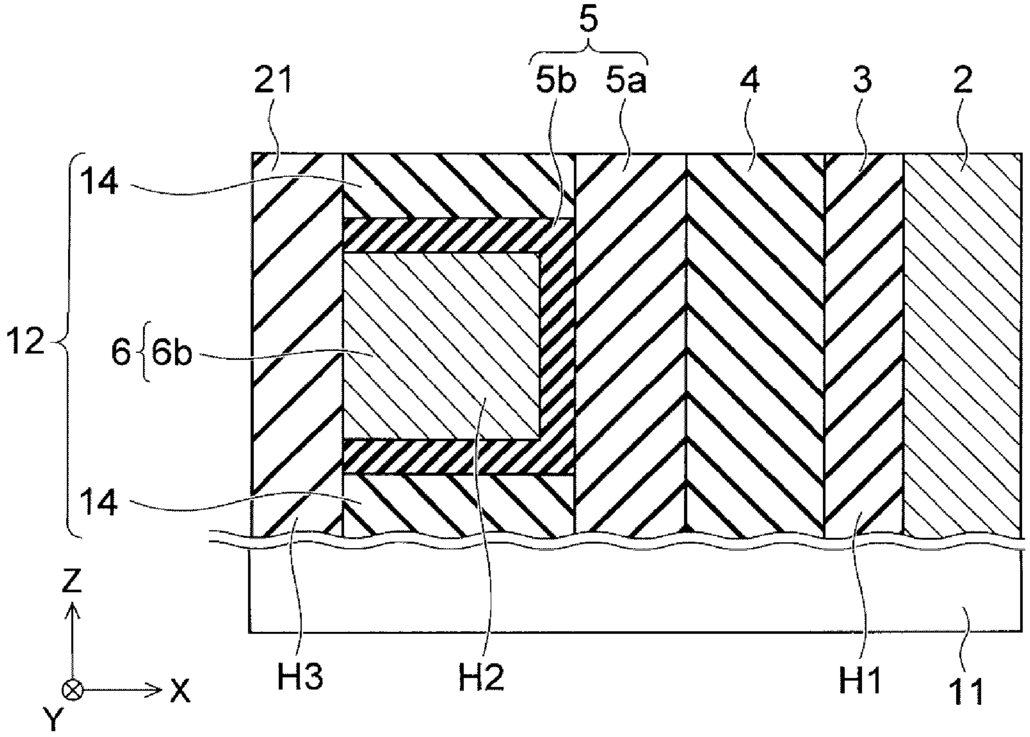

FIGS. 10A and 10B are cross-sectional views showing the method for manufacturing a semiconductor device according to a modification example of the first embodiment.

The steps in FIG. 10A and FIG. 10B are performed in the same manner as the steps in FIG. 9A and FIG. 9B. However, in the step of FIG. 10B, the barrier metal layer 6*a* is not formed. As described above, the step of forming the barrier metal layer 6*a* may be omitted.

The electrode material layer 6*b* in FIG. 9B or FIG. 10B may be a metal layer other than the W layer, for example, may be a molybdenum (Mo) layer. In addition, the barrier metal layer 6*a* in FIG. 9B may be a metal layer other than the TiN film, for example, may be a titanium-containing film other than the TiN film or a film containing a metal element other than titanium (for example, tantalum).

As described above, in the present embodiment, the relationship of $A_3 \geq A_4 \geq A_{5a} \geq A_{5b}$ is established between the H concentration $A_3$ in the tunnel insulating film 3, the H concentration $A_4$ in the charge storage layer 4, the H concentration $A_{5a}$ in the insulating film 5*a*, and the H concentration $A_{5b}$ in the insulating film 5*b*. Therefore, according to the present embodiment, it is possible to form a memory cell having suitable characteristics. For example, by realizing the relationship of $A_3 \geq A_4 \geq A_{5a} \geq A_{5b}$, it is possible to improve the write saturation and the write efficiency of the memory cell. In addition, according to the present embodiment, by performing the RTP using a gas containing nitrogen and oxygen (for example, $N_2O$ gas), it is possible to realize the relationship of $A_3 \geq A_4 \geq A_{5a} \geq A_{5b}$.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:

a stacked film including a plurality of electrode layers and a plurality of first insulating films alternately stacked on top of one another;

a second insulating film extending along an upper surface, a lower surface, and a side surface of at least one electrode layer of the plurality of electrode layers;

a charge storage layer extending along a side surface of the second insulating film, with a third insulating film interposed between the second insulating film and the charge storage layer; and a semiconductor layer extending along a side surface of the charge storage layer, with a fourth insulating film interposed between the charge storage layer and the semiconductor layer, wherein a hydrogen concentration in the fourth insulating film is equal to or higher than a hydrogen concentration in the charge storage layer, the hydrogen concentration in the charge storage layer is equal to or higher than a hydrogen concentration in the third insulating film, and the hydrogen concentration in the third insulating film is equal to or higher than a hydrogen concentration in the second insulating film.

2. The semiconductor device according to claim 1, wherein the second insulating film includes hafnium, aluminum, or zirconium.

3. The semiconductor device according to claim 2, wherein the second insulating film further includes oxygen.

4. The semiconductor device according to claim 1, wherein the hydrogen concentration in the charge storage layer is equal to or lower than about $1.0\times10^{20}$ atoms/cm$^3$.

5. The semiconductor device according to claim 1, wherein the fourth insulating film, the charge storage layer, the third insulating film, and the second insulating film each include hydrogen atoms as impurity atoms.

6. The semiconductor device according to claim 1, wherein the hydrogen concentrations in the fourth insulating film, the charge storage layer, the third insulating film, and the second insulating film each increase in a first direction from the second insulating film toward the fourth insulating film.

* * * * *